United States Patent
Woo et al.

(10) Patent No.: US 11,791,856 B2
(45) Date of Patent: *Oct. 17, 2023

(54) TRANSIMPEDANCE AMPLIFIER (TIA) WITH TUNABLE INPUT RESISTANCE

(71) Applicant: Apple Inc., Cupertino, CA (US)

(72) Inventors: Sang Hyun Woo, Austin, TX (US); Florian Mrugalla, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/945,226

(22) Filed: Sep. 15, 2022

(65) Prior Publication Data
US 2023/0019152 A1 Jan. 19, 2023

Related U.S. Application Data

(63) Continuation of application No. 17/375,843, filed on Jul. 14, 2021, now Pat. No. 11,595,069.

(51) Int. Cl.
*H04B 1/18* (2006.01)
*H03F 1/18* (2006.01)
(Continued)

(52) U.S. Cl.
CPC ............... *H04B 1/18* (2013.01); *H03F 1/18* (2013.01); *H03F 3/24* (2013.01); *H04B 1/40* (2013.01);
(Continued)

(58) Field of Classification Search
CPC ............ H03F 1/18; H03F 2200/294; H03F 2200/451; H03F 3/24; H04B 1/005;
(Continued)

(56) References Cited

U.S. PATENT DOCUMENTS

| 5,602,510 A | 2/1997 | Bayruns et al. |
| 6,259,312 B1 | 7/2001 | Murtojarvi |

(Continued)

FOREIGN PATENT DOCUMENTS

| JP | 2010147988 A | 7/2010 |
| JP | 2014036293 A | 2/2014 |

(Continued)

OTHER PUBLICATIONS

Essam S. Atalla et al., Novel Analysis of Passive Mixer Output Impedance Using Switched-Capacitor Techniques, 2013 IEEE 56th International Midwest Symposium on Circuits and Systems (MWSCAS), Aug. 4, 2013, pp. 625-628, EEE, Columbus, Ohio.

*Primary Examiner* — Nguyen T Vo
(74) *Attorney, Agent, or Firm* — TREYZ LAW GROUP; Jason Tsai

(57) ABSTRACT

An electronic device may include wireless circuitry with a baseband processor, a transceiver, and an antenna. The transceiver may include a mixer that outputs signals to a transimpedance amplifier. The mixer has an output impedance that varies depending on the frequency of operation. An adjustable resistance can be coupled to the input of the transimpedance amplifier. A control circuit can tune the adjustable resistance to compensate for changes in the output impedance of the mixer as the transceiver operates across a wide range of frequencies.

19 Claims, 9 Drawing Sheets

(51) Int. Cl.
 *H03F 3/24* (2006.01)
 *H04B 1/40* (2015.01)

(52) U.S. Cl.
 CPC .. *H03F 2200/294* (2013.01); *H03F 2200/451* (2013.01)

(58) Field of Classification Search
 CPC .......... H04B 1/10; H04B 1/1638; H04B 1/18; H04B 1/40
 See application file for complete search history.

(56) References Cited

U.S. PATENT DOCUMENTS

| | | | |
|---|---|---|---|
| 6,404,281 B1 | 6/2002 | Kobayashi | |
| 8,089,309 B2 | 1/2012 | Jansen et al. | |
| 3,406,358 A1 | 3/2013 | Jehara et al. | |
| 8,406,358 B1 * | 3/2013 | Uehara | H04B 1/0028 455/296 |
| 8,577,305 B1 | 11/2013 | Rossi et al. | |
| 9,356,636 B1 | 5/2016 | Mak et al. | |
| 10,153,934 B1 * | 12/2018 | Gathman | H04L 27/2688 |
| 11,595,069 B2 * | 2/2023 | Woo | H03F 3/24 |
| 2010/0207678 A1 | 8/2010 | Hesen et al. | |
| 2011/0124307 A1 | 5/2011 | Balankutty et al. | |
| 2013/0188755 A1 | 7/2013 | Lu et al. | |
| 2013/0214979 A1 | 8/2013 | McMilin et al. | |
| 2013/0259172 A1 | 10/2013 | Mikhemar et al. | |
| 2014/0043099 A1 | 2/2014 | Igarashi et al. | |
| 2015/0084688 A1 | 3/2015 | Chang et al. | |
| 2015/0326185 A1 | 11/2015 | Mikhemar et al. | |
| 2016/0142085 A1 | 5/2016 | Choksi et al. | |
| 2017/0201280 A1 | 7/2017 | Hedayati et al. | |
| 2021/0075457 A1 | 3/2021 | Meng | |
| 2021/0105007 A1 | 4/2021 | Chang | |

FOREIGN PATENT DOCUMENTS

| | | |
|---|---|---|
| JP | 2017539151 A | 12/2017 |
| WO | 2016076981 A1 | 5/2016 |

* cited by examiner

TRANSIMPEDANCE AMPLIFIER (TIA) WITH TUNABLE INPUT RESISTANCE

This application is a continuation of patent application Ser. No. 17/375,843, filed Jul. 14, 2021, which is incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive radio-frequency signals.

Signals received by the antennas are fed through a receiver, which often includes a mixer coupled to a transimpedance amplifier. It can be challenging to design a satisfactory receiver for an electronic device.

SUMMARY

An electronic device may include wireless communications circuitry. The wireless communications circuitry may include an antenna, a transceiver configured to receive radio-frequency signals from the antenna and to generate corresponding baseband signals, and a baseband processor configured to receive the baseband signals from the transceiver.

An aspect of the disclosure provides wireless circuitry operable in multiple radio-frequency bands and multiple radio-frequency standards. The wireless circuitry can include: an antenna configured to receive a radio-frequency signal; a first amplifier having an input coupled to the antenna and having an output; an oscillator circuit; a mixer having a first input coupled to the output of the first amplifier, having a second input coupled to the oscillator circuit, and having an output with an output impedance; a second amplifier having an input coupled to the output of the mixer; and an adjustable resistor coupled to the input of the second amplifier and configured to compensate for changes in the output impedance of the mixer as the wireless circuitry is operated across the plurality of radio-frequency bands. One or more shunt capacitors can be coupled to the input of the second amplifier. One or more feedback capacitors and feedback resistors can be coupled across the input and output of the second amplifier. The first amplifier can be a low noise amplifier, whereas the second amplifier can be a wideband transimpedance amplifier. The adjustable resistor can include multiple resistive strings each having at least one resistor and at least one switch selectively activated and deactivated depending on the operating frequency of the wireless circuitry.

An aspect of the disclosure provides a method of operating wireless circuitry in a plurality of radio-frequency bands. The method can include: using an antenna to receive a radio-frequency signal; using a first amplifier to receive signals from the antenna; using a mixer to receive signals from the first amplifier and to receive signals from an oscillator, the mixer having an output impedance; using a second amplifier to receive signals from the mixer; and tuning an adjustable resistor coupled to an input of the second amplifier to compensate for changes in the output impedance of the mixer as the wireless circuitry is operated across the plurality of radio-frequency bands. The adjustable resistor can be tuned to provide a first resistance value when the wireless circuitry is operating in a first radio-frequency band in the plurality of radio-frequency bands and can be tuned to provide a second resistance value greater than the first resistance value when the wireless circuitry is operating in a second radio-frequency band in the plurality of radio-frequency bands greater than the first radio-frequency band.

An aspect of the disclosure provides an electronic device. The electronic device can include: an antenna configured to receive radio-frequency signals; a baseband processor configured to receive baseband signals generated based on the radio-frequency signals; an oscillator; a mixer having a first input coupled to the antenna, having a second input coupled to the oscillator, and having an output; an amplifier having an input coupled to the output of the mixer; and an adjustable resistor coupled to the input of the amplifier. The electronic device can also include a control circuit configured to tune the adjustable resistor as a function of the operating frequency of the amplifier. One or more shunt capacitors can be coupled to the input of the amplifier. One or more feedback capacitors and feedback resistors can be coupled across the input and output of the amplifier. The amplifier can be a wideband transimpedance amplifier.

DETAILED DESCRIPTION

An electronic device may be provided with wireless receiver circuitry. The wireless receiver circuitry may include an antenna, a low noise amplifier configured to receive radio-frequency signals from the antenna, a mixer configured to receive signals from the low noise amplifier and to receive an oscillator signal, and a transimpedance amplifier configured to receive signals from the mixer. The wireless receiver circuitry may be operated in multiple radio-frequency bands across multiple standards. The mixer can have an output impedance that varies across the different radio-frequency bands. An adjustable resistor can be provided at the input of the transimpedance amplifier to compensate for the variation in the mixer output impedance. Configuring and operating the receiver circuitry in this way allows the performance of the transimpedance amplifier to be maintained across the different radio-frequency bands.

Figure 1:
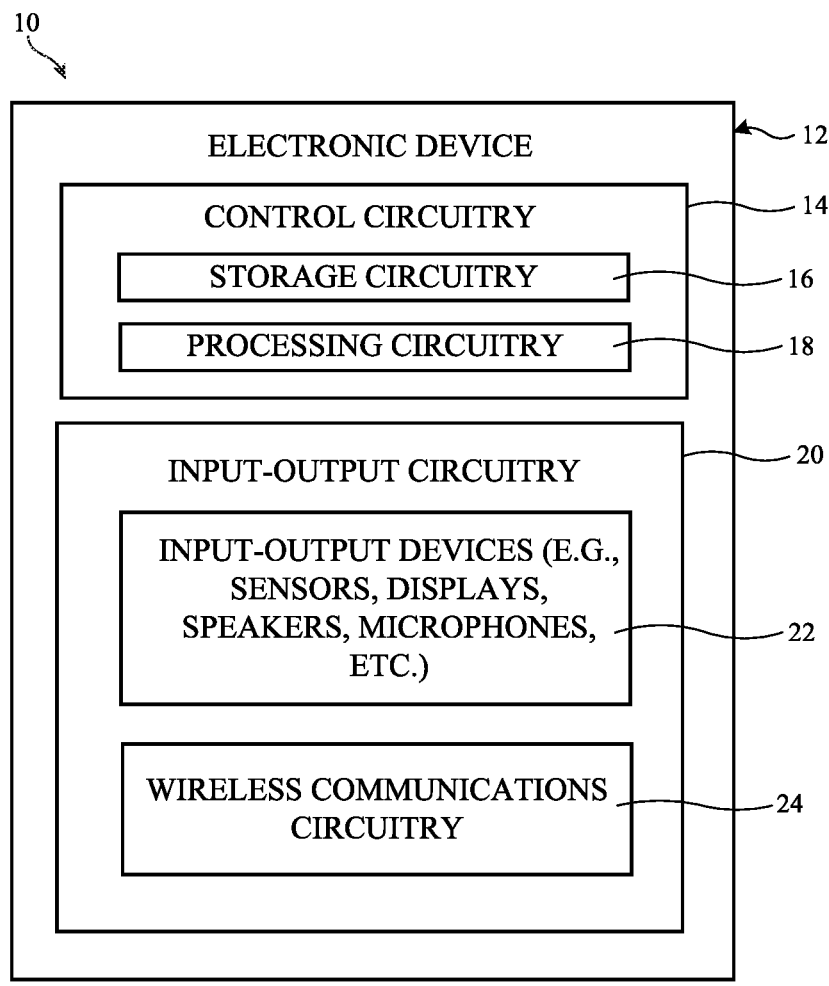
FIG. 1 is a diagram of an illustrative electronic device having wireless communications circuitry in accordance with some embodiments.

FIG. 1 is a diagram of an electronic device such as electronic device 10 that can be provided with such wireless receiver circuitry. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 24 may include wireless communications circuitry such as wireless communications circuitry 24 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Figure 2:
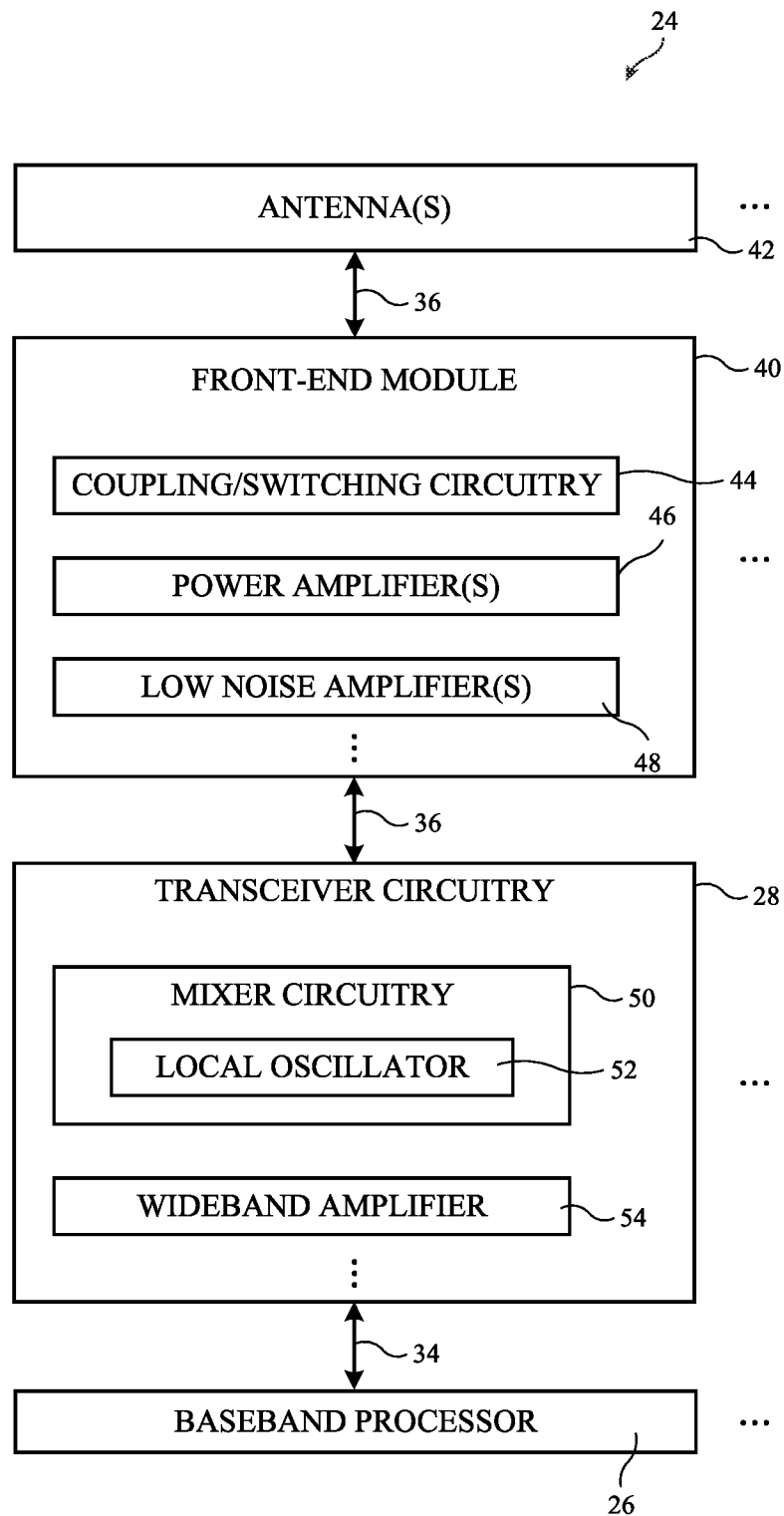
FIG. 2 is a diagram of illustrative wireless communications circuitry having transceiver circuitry in accordance with some embodiments.

FIG. 2 is a diagram showing illustrative components within wireless circuitry 24. As shown in FIG. 2, wireless circuitry 24 may include a baseband processor such as baseband processor 26, radio-frequency (RF) transceiver circuitry such as radio-frequency transceiver 28, radio-frequency front end circuitry such as radio-frequency front end module (FEM) 40, and antenna(s) 42. Baseband processor 26 may be coupled to transceiver 28 over baseband path 34. Transceiver 28 may be coupled to antenna 42 via radio-frequency transmission line path 36. Radio-frequency front end module 40 may be interposed on radio-frequency transmission line path 36 between transceiver 28 and antenna 42.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 28, any desired number of front end modules 40, and any desired number of antennas 42. Each baseband processor 26 may be coupled to one or more transceiver 28 over respective baseband paths 34. Each transceiver 28 may include one or more transmitters configured to output uplink signals to antenna 42, may include one or more receivers configured to receive downlink signals from antenna 42, and may be coupled to one or more antennas 42 over respective radio-frequency transmission line paths 36. Each radio-frequency transmission line path 36 may have a respective front end module 40 interposed thereon. If desired, two or more front end modules 40 may be interposed on the same radio-frequency transmission line path 36. If desired, one or more of the radio-frequency transmission line paths 36 in wireless circuitry 24 may be implemented without any front end module interposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, baseband processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry 50 for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding baseband signals. For example, transceiver 28 may use mixer circuitry 50 for down-converting (or demodulating) the received radio-frequency signals to baseband frequencies prior to conveying the received signals to baseband processor 26 over baseband path 34. Mixer circuitry 50 can include oscillator circuitry such as a local oscillator 52. Local oscillator 52 can generate oscillator signals that mixer circuitry 50 uses to modulate transmitting signals from baseband frequencies to radio frequencies and/or to demodulate the received signals from radio frequencies to baseband or intermediate frequencies. Transceiver 28 may further include an amplifier such as amplifier 54 configured to filter signals output from mixer circuitry 50.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as filter circuitry (e.g., low pass filters, high pass filters, notch filters, band pass filters, radio-frequency coupling/switching circuitry 44 (e.g., radio-frequency coupler, multiplexing circuitry, duplexer circuitry, diplexer circuitry, triplexer circuitry, one or more radio-frequency switches, etc.), radio-frequency amplifier circuitry such as one or more power amplifiers 46 and one or more low noise amplifiers 48, impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Circuitry 44, amplifiers 46 and 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26 and/or portions of transceiver 28 (e.g., a host processor on transceiver 28) may form a part of control circuitry 14. Control circuitry 14 (e.g., portions of control circuitry 14 formed on baseband processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
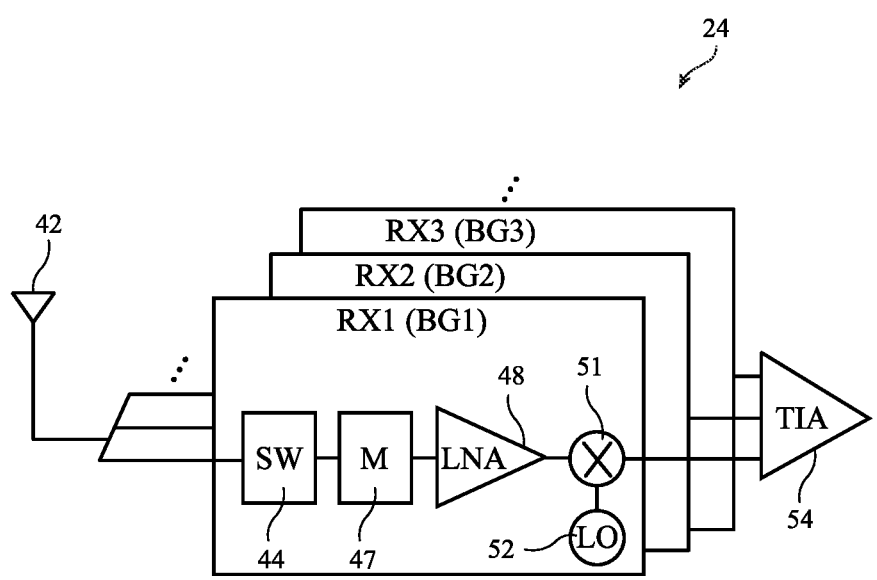
FIG. 3 is a diagram of illustrative multi-standard receiver circuitry in accordance with some embodiments.

Wireless circuitry 24 may be operable in multiple radio-frequency bands. FIG. 3 is a diagram showing wireless circuitry 24 having multiple receiver blocks for handling (receiving) signals from the various radio-frequency bands. As shown in FIG. 3, wireless circuitry 24 may include a first receiver block RX1 configured to receive from antenna 42 signals in a first radio-frequency band group BG1, a second receiver block RX2 configured to receive from antenna 42 signals in a second radio-frequency band group BG2, a third receiver block RX3 configured to receive from antenna 42 signals in a third radio-frequency band group BG3, and so on. Each radio-frequency band group may generally include multiple radio-frequency bands. During normal operation, only a selected one of the receiver blocks is activated depending on the desired radio-frequency band of operation. As an example, BG1 may cover communications in the 0.6 to 1 GHz range, BG2 may cover communications in the 1 to 1.8 GHz range, and BG3 may cover communications in the 1.8 to 2.3 GHz range. These radio-frequency band ranges are merely illustrative. In general, each radio-frequency band can cover 400 MHz, less than 400 MHz, greater than 400 MHz, 500 MHz, 600 MHz, 700 MHz, or other frequency ranges. Local oscillator 52 can be used to supply oscillator signals to one or more receiver blocks. For example, a first local oscillator 52 might be used to cover both band groups BG1 and BG2. A second local oscillator 52 might be used to cover only a single band group BG3 (as an example). A third local oscillator 52 might be used to cover three or more band groups.

The example of FIG. 3 in which wireless circuitry 24 includes three separate receiver blocks for handling different radio-frequency bands is merely illustrative. Such type of wireless receiver circuitry is sometimes referred to as a multi-band or multi-standard receiver. If desired, the receiver circuitry may include more or less than three separate receiver blocks. Amplifier 54 used within such multi-standard receiver is sometimes referred to herein as a "wideband" amplifier.

Each of receiver blocks RX1, RX2, and RX3 may include a switching circuit such as radio-frequency switch 44 coupled to antenna 42 (or to a radio-frequency duplexer), a matching circuit such as matching circuit 47, a radio-frequency amplifier such as low noise amplifier (LNA) 48 configured to receive signals from switch 44, and a mixer circuit such as radio-frequency mixer 51 configured to receive amplified signals from low noise amplifier 48 and to receive an oscillator signal from a local oscillator 52. Wireless circuitry 24 may include a single amplifier circuit such as amplifier 54 coupled to mixer 51 in each of the multiple receiver blocks. Amplifier 54 may, for example, be a transimpedance amplifier (TIA). Amplifier 54 may be a wideband amplifier that is capable of handling communications across all of the various radio-frequency band groups (e.g., BG1, BG2, BG3, etc.). Amplifier 54 of this type having a wide bandwidth while being capable of handling communications across multiple radio-frequency bands (standards) is sometimes referred to as a multi-band (multi-standard), wideband amplifier.

Figure 4:
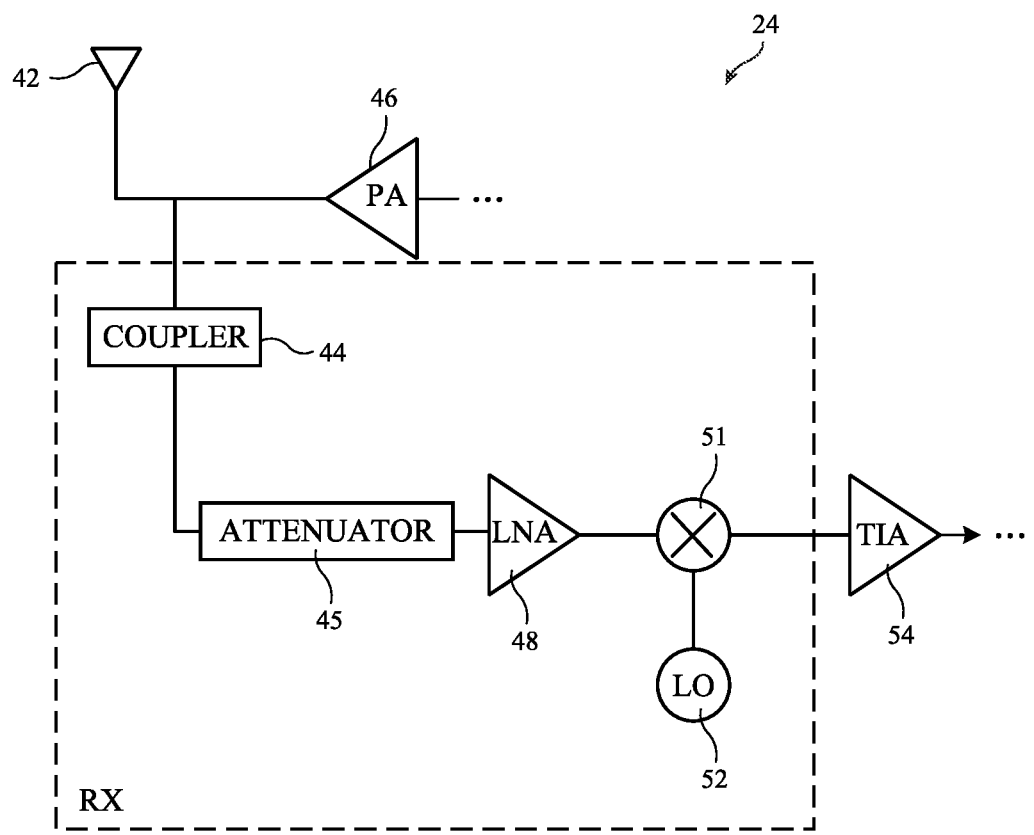
FIG. 4 is a diagram of illustrative feedback receiver circuitry in accordance with some embodiments.

The example of FIG. 3 in which wireless circuitry 24 includes multiple receiver blocks is merely illustrative. FIG. 4 shows another embodiment in which wireless circuitry 24 is a feedback receiver capable of handling wireless communications in the various radio-frequency bands. The feedback receiver of FIG. 4 can be used for power control and calibrating the transmit signal. As shown in FIG. 4, antenna 42 may be coupled to a transmit amplifier such as power amplifier 46 and may be coupled to receiver block RX via a radio-frequency coupler such as directional coupler 44. Receiver block RX may further include a radio-frequency attenuating circuit such as attenuator 45 connected to coupler 44, a low noise amplifier (LNA) 48 configured to receive signals from coupler 44 via attenuator 45, and a radio-frequency mixer circuit such as mixer 51 configured to receive signals from low noise amplifier 48 and to receive an oscillator signal from local oscillator 52. Mixer 51 may output demodulated signals to amplifier 54. Amplifier 54 may be a multi-band, wideband transimpedance amplifier (as an example).

Receiver block RX may be configured to handle a wide range of radio-frequency bands. For example, receiver block RX may be operated in a first mode to handle wireless communications in a first radio-frequency band group from about 0.6 to 1 GHz, in a second mode to handle wireless communications in a second radio-frequency band group from about 1 to 1.8 GHz, in a third mode to handle wireless communications in a third radio-frequency band group from about 1.8 to 2.3 GHz, in a fourth mode to handle wireless communications in a fourth radio-frequency band group from about 2.3 to 2.9 GHz, and so on up to 7 GHz or greater. These radio-frequency bands are merely illustrative. The arrangement of FIG. 4 in which a single receiver block RX is coupled to transmit amplifier 46 via a directional coupler 44 is sometimes referred to as a feedback receiver architecture. Compared to the multi-standard receiver of FIG. 3, the feedback receiver of FIG. 4 generally exhibits a more relaxed noise sensitivity requirement.

Figure 5:
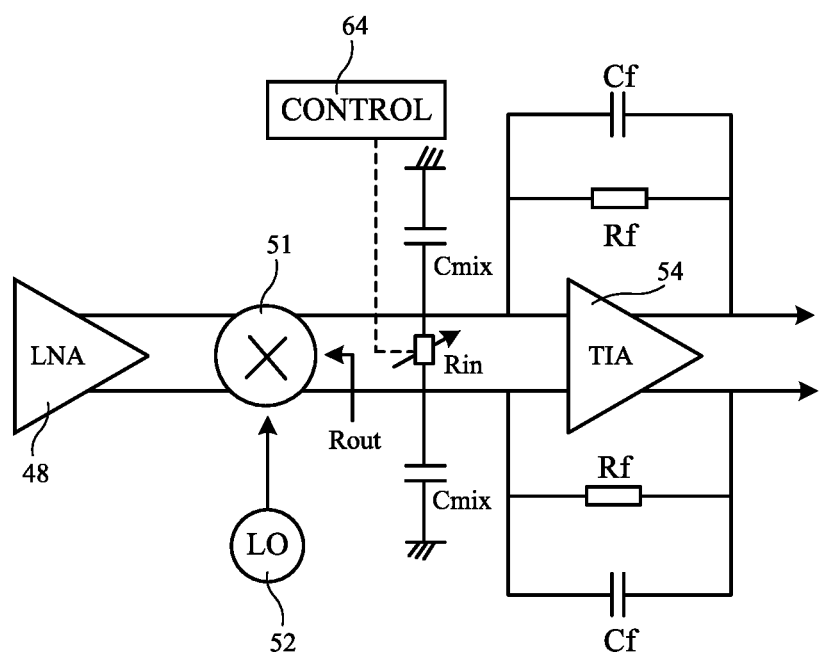
FIG. 5 is a diagram of illustrative receiver circuitry having an adjustable resistor coupled between a mixer and an amplifier in accordance with some embodiments.

FIG. 5 is a diagram showing additional details at the interface between mixer 51 and transimpedance amplifier 54, which are applicable to the multi-standard receiver of the type described in connection with FIG. 3, the feedback receiver of the type described in connection with FIG. 4, and/or other wireless receiver architectures utilizing a wideband amplifier. As shown in FIG. 5, low noise amplifier 48, mixer 51, and transimpedance amplifier 54 may be differential circuits having differential input terminals and differential output terminals.

A set of shunt capacitors Cmix can be coupled to the output of mixer 51, which is also coupled to the input of amplifier 54. For instance, a first capacitor Cmix in the set of shunt capacitors has a first terminal coupled to a first input of amplifier 54 and a has a second terminal coupled to a ground power supply line (sometimes referred to as a ground line or ground), whereas a second capacitor Cmix in the set of shunt capacitors has a first terminal coupled to a second input of amplifier 54 and has a second terminal coupled to the ground line.

A set of feedback capacitors Cf can also be coupled across the input and output terminals of amplifier 54. For example, a first feedback capacitor Cf in the set of feedback capacitors has a first terminal coupled to the first input of amplifier 54 and has a second terminal coupled to a first output of amplifier 54. A second feedback capacitor Cf in the set of feedback capacitors has a first terminal coupled to the second input of amplifier 54 and has a second terminal coupled to a second output of amplifier 54.

A set of feedback resistors Rf can also be coupled across the input and output terminals of amplifier 54. For example, a first feedback resistor Rf in the set of feedback resistors has a first terminal coupled to the first input of amplifier 54 and has a second terminal coupled to the first output of amplifier 54 (i.e., first feedback resistor Rf may be coupled in parallel with first feedback capacitor Cf). A second feedback resistor Rf in the set of feedback resistors has a first terminal coupled to the second input of amplifier 54 and has a second terminal coupled to the second output of amplifier 54 (i.e., second feedback resistor Rf may be coupled in parallel with second feedback capacitor Cf). Configured in this way, transimpedance amplifier 54 and associated components Cmix, Cf, and Rf may be used collectively as a low pass filter circuit to provide low pass filtering functions and may sometimes be referred to as a baseband filter or baseband active filter. Each of the capacitors Cmix and/or Cf shown in FIG. 5 may include a bank of switchable capacitors that can be adjusted by controller 64 to optionally tune the bandwidth of the baseband filter. Each of the feedback resistors Rf may also include a bank of switchable resistors that can be adjusted by controller 64 to optionally tune the gain of the baseband filter. Components Cmix, Cf, and Rf can be adjusted to control the bandwidth of the filter, whereas resistor Rf can be adjusted to control the gain of the filter.

Figure 6:
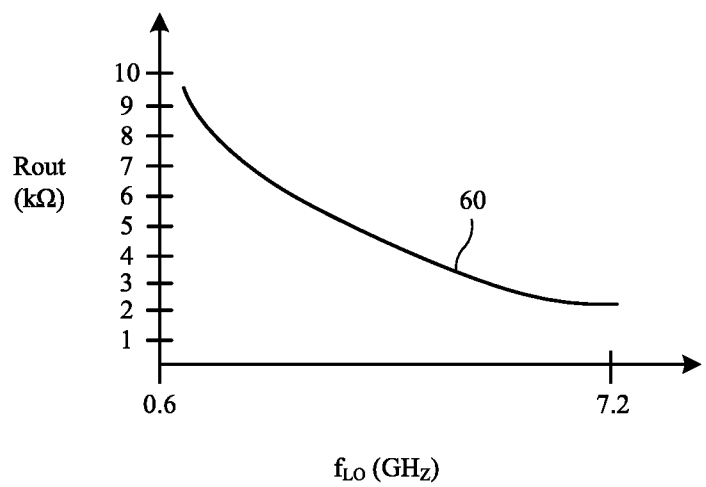
FIG. 6 is a diagram plotting a mixer output impedance as a function of oscillator frequency in accordance with some embodiments.

Mixer 51 may have an output impedance Rout. The mixer output impedance Rout may be inversely proportional to the product of Cpar and fin, where Cpar represents the parasitic capacitance at the output of LNA 48 and where fin represents the frequency of the oscillator signal generated by local oscillator 52. FIG. 6 is a diagram plotting mixer output impedance Rout as a function of oscillator frequency fin. As shown in FIG. 6, oscillator frequency fin may be varied across a wide frequency range (e.g., from 0.6 to 7.2 GHz) when supporting wideband operation. Since mixer output impedance Rout is inversely proportional to $f_{LO}$, Rout decreases as frequency $f_{LO}$ increases (as indicated by curve 60). Curve 60 shows how Rout can vary greatly (e.g., from more than 9 kΩ to less than 3 kΩ) across the wide operating frequency range of the oscillator. These Rout values are merely illustrative. The mixer Rout values can vary widely depending on the intended application and actual design of the receiver.

The bandwidth and stability of amplifier 54 varies as a function of mixer output impedance Rout. Thus, large variations in the mixer Rout can potentially degrade the amplifier bandwidth as the receiver operates in the different radio-frequency bands. One way of maintaining the target bandwidth of amplifier 54 as the mixer Rout varies is to tune the shunt capacitor(s) Cmix. Tuning Cmix and/or Cf to compensate for changes in mixer Rout can, however, cause the quality factor and the phase margin of amplifier 54 to change, which makes it challenging to design a receiver that satisfies performance criteria across all operating frequencies.

In accordance with some embodiments, an adjustable resistive circuit such as adjustable resistor Rin is coupled to the input of amplifier 54 to adjust the input impedance of amplifier 54 to help compensate for variations in mixer output impedance Rout (see, e.g., FIG. 5). Adjustable resistor Rin may have a first terminal coupled to the first input of amplifier 54 and a second terminal coupled to the second input of amplifier 54 (e.g., resistor Rin may be coupled across the differential input terminals of amplifier 54). Connected in this way, adjustable resistor Rin is effectively coupled in parallel with the mixer output impedance Rout.

Figure 7:
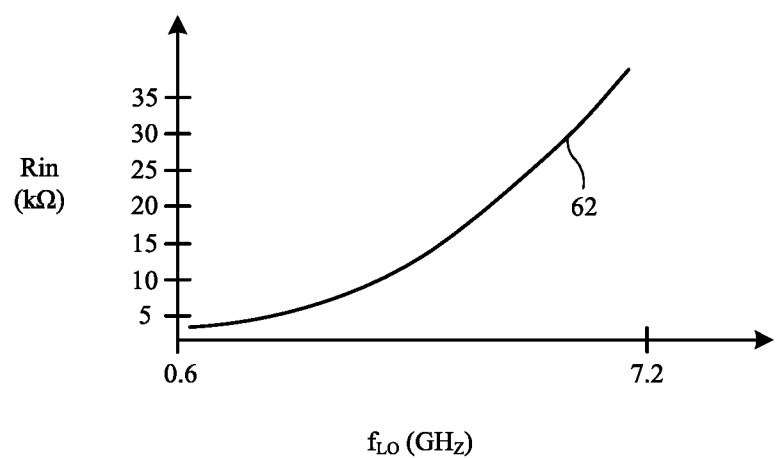
FIG. 7 is a diagram plotting the resistance of an adjustable resistor configured to compensate for changes in the mixer output impedance as a function of oscillator frequency in accordance with some embodiments.

FIG. 7 is a diagram plotting the resistance of adjustable resistor Rin as a function of oscillator frequency $f_{LO}$. As shown by curve 62 in FIG. 7, resistor Rin may be tuned to exhibit an increasing resistance (i.e., an increasing real impedance value) as oscillator frequency $f_{LO}$ is increased. Resistor Rin should be tuned such that the total parallel resistance of Rout and Rin remains constant across all of the radio-frequency bands of interest. Operated in this way, adjustable resistor Rin can be used to maintain the bandwidth of amplifier 54 by compensating for changes in the mixer Rout across the entire range of operating frequencies (e.g., Rin is increased when the mixer Rout decreases, and vice versa). Using adjustable (tunable) resistor Rin to compensate for variations in mixer Rout obviates the need to tune shunt capacitor(s) Cmix when changing from one operating frequency band to another, which can help ensure that the Q factor and the phase margin of amplifier 54 meets performance criteria across the entire range of operating frequencies.

Figure 8:
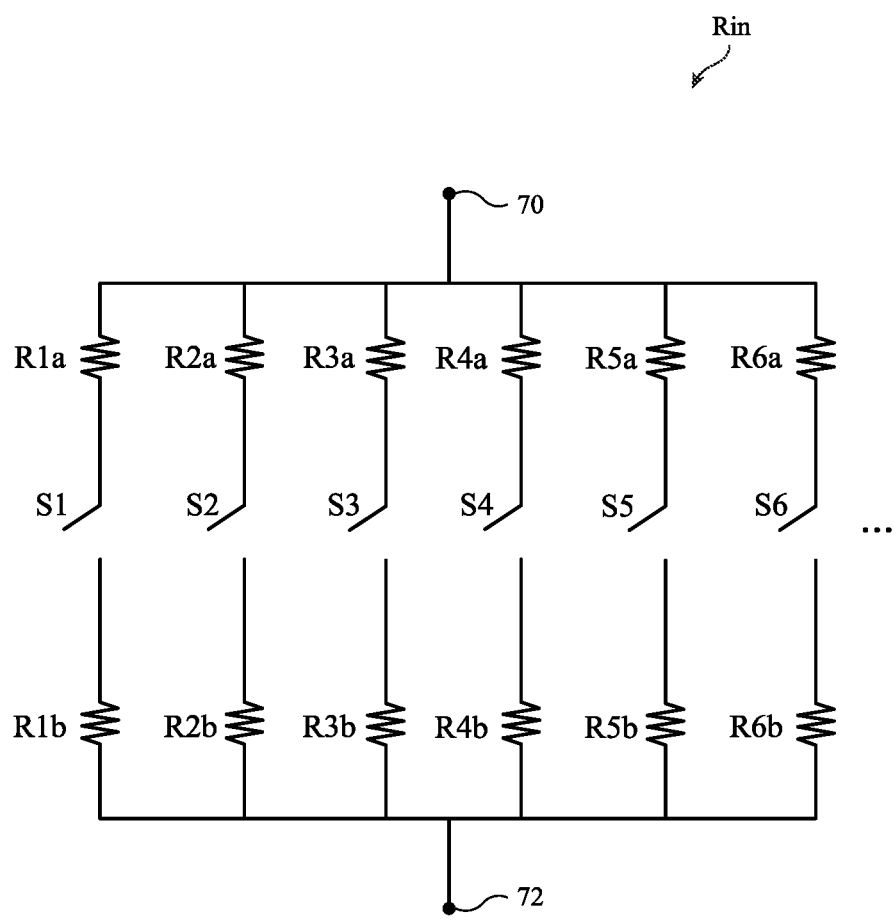
FIG. 8 is a circuit diagram of an illustrative adjustable resistor configured to compensate for changes in the mixer output impedance when operated across different radio-frequency bands in accordance with some embodiments.

FIG. 8 shows one suitable implementation of adjustable resistor Rin. As shown in FIG. 8, resistor Rin can have multiple strings of resistors coupled together in parallel between terminals 70 and 72. Terminal 70 may be coupled to the first input terminal of amplifier 54, whereas terminal 72 may be coupled to the second input terminal of amplifier 54.

Adjustable resistor Rin (sometimes referred to as an adjustable resistance, adjustable resistor circuit, or an adjustable resistive circuit having real impedance values) may include multiple resistive strings such as a first resistor string having resistors R1*a* and R1*b* selectively activated by switch S1 (e.g., switch S1 may be coupled in series between resistors R1*a* and R1b), a second resistor string having resistors R2*a* and R2*b* selectively activated by switch S2 (e.g., switch S2 may be coupled in series between resistors R2*a* and R2*b*), a third resistor string having resistors R3*a* and R3*b* selectively activated by switch S3 (e.g., switch S3 may be coupled in series between resistors R3*a* and R3*b*), and so on. Switches S1-S6 can be controlled by a switch control circuit such as control circuit 64 of FIG. 5. Switch control circuit 64 may be part of control circuitry 14 (see, e.g., FIG. 1).

The example of FIG. 8 in which resistor Rin has six switchable resistor strings is merely illustrative. In general, resistor Rin can have any desired number of resistor strings. The various resistor strings in Rin can have the same resistance value or different resistance values. The on resistance of each resistor string in adjustable resistor Rin can be selected to provide the desired range of resistance to compensate for changes in the mixer Rout (e.g., such that different switch configurations can provide the corresponding compensation value of Rin as shown in curve 62 of FIG. 7 depending on the operating frequency of the wireless receiver). For example, when operating in the highest radio-frequency band, all of the Rin switches can be turned off (deactivated). On the other hand, when operating in the lowest radio-frequency band, all of the Rin switches can be turned on (activated) to provide the lowest total resistance. Different subsets of switches can be selectively activated for operating frequencies between the two extremes. Control circuit 64 (see FIG. 5) may store a lookup table (as an example) that determines which group of switches to activate depending on the current operating frequency. The gain, bandwidth, linearity, noise, and phase margin of amplifier 54 can be maintained for all resistance values of Rin.

Figure 9:
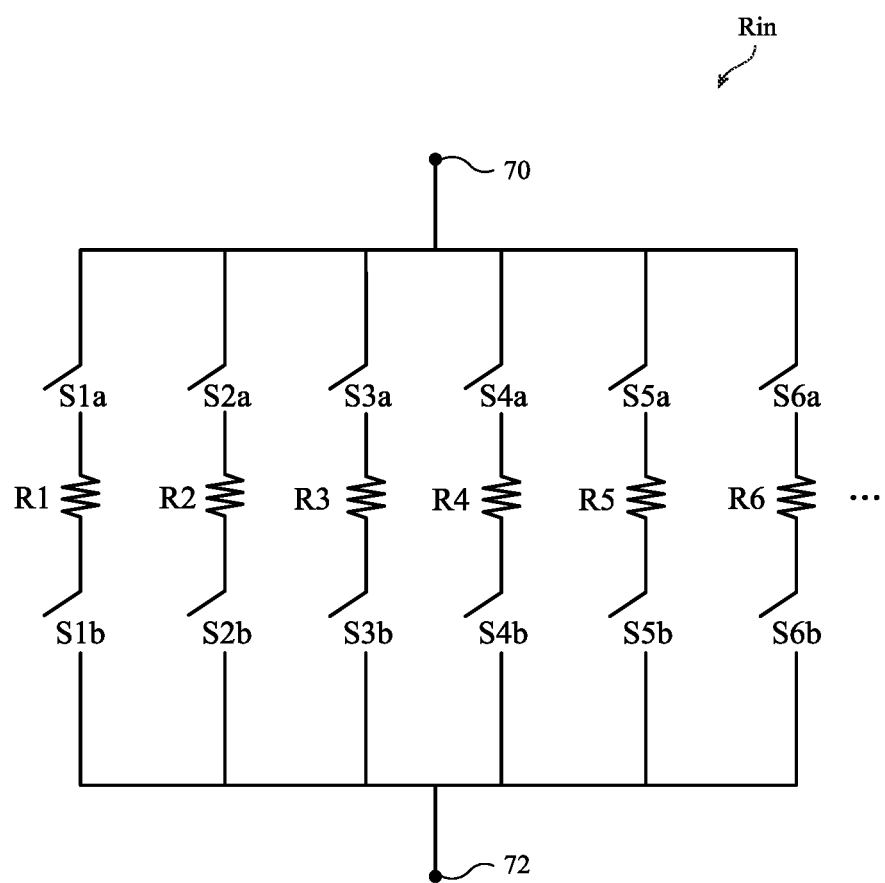
FIG. 9 is a circuit diagram showing another embodiment of an illustrative adjustable resistor configured to compensate for changes in the mixer output impedance when operated across different radio-frequency bands.

The example of FIG. 8 in which each resistor string in Rin has two resistors and one switch is merely illustrative. FIG. 9 shows another suitable implementation of adjustable resistor Rin having resistor strings each with a single resistor and two switches. As shown in FIG. 9, adjustable resistor Rin (sometimes referred to as a resistor circuit or a resistive circuit having real impedance values) may include: a first resistor string having resistor R1 selectively activated by switches S1*a* and S1*b* (e.g., resistor R1 may be coupled in series between switches S1*a* and S1*b*); a second resistor string having resistor R2 selectively activated by switches S2*a* and S2*b* (e.g., resistor R2 may be coupled in series between switches S2*a* and S2*b*); a third resistor string having resistor R3 selectively activated by switches S3*a* and S2*b* (e.g., resistor R3 may be coupled in series between switches S3*a* and S3*b*), and so on. These switches can be controlled by a switch control circuit such as control circuit 64 of FIG. 5.

The example of FIG. 9 in which resistor Rin has six switchable resistor strings is merely illustrative. In general, resistor Rin can have any desired number of resistor strings. The various resistor strings in Rin can have the same resistance value or different resistance values. The on resistance of each resistor string in adjustable resistor Rin can be selected to provide the desired range of resistance to compensate for changes in the mixer Rout (e.g., such that different switch configurations can provide the corresponding compensation value of Rin as shown in curve 62 of FIG. 7 depending on the operating frequency of the wireless receiver). The gain, bandwidth, linearity, noise, and phase margin of amplifier 54 can be maintained for all resistance values of Rin. If desired, each resistor string might only have one resistor and one switch (e.g., the first resistor string can have only resistor R1 coupled in series with S1a while omitting S1b; the second resistor string can have only resistor T2 coupled in series with S2a while omitting S2b; etc.)

Figure 10:
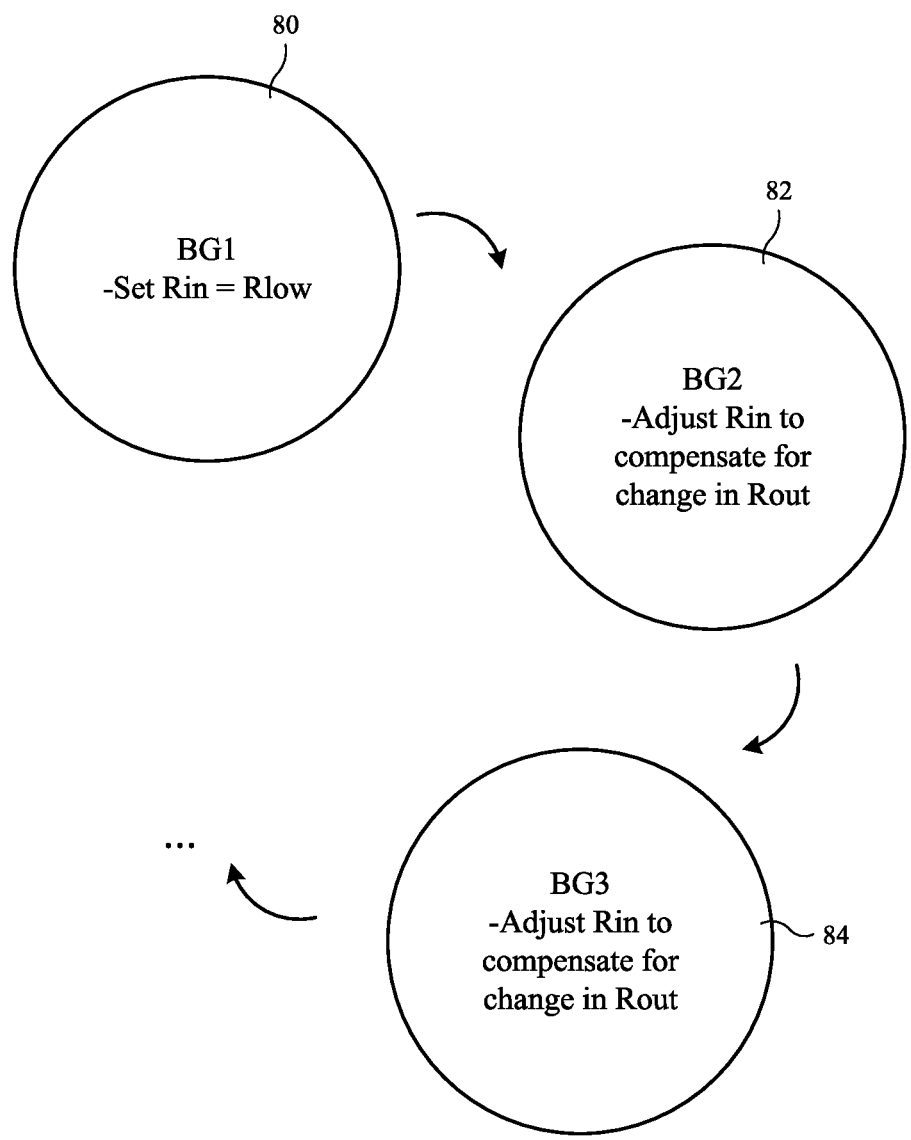
FIG. 10 is a diagram showing different modes for operating receiver circuitry of the type shown in connection with FIGS. 1-9 in accordance with some embodiments.

FIG. 10 is a diagram showing different modes of operation for receiver circuitry of the type shown in connection with FIGS. 1-9. As shown in FIG. 10, the receiver circuitry can be operated in a first mode such as mode 80 during which the receiver receives signals in a first radio-frequency band group BG1, in a second mode such as mode 82 during which the receiver receives signals in a second radio-frequency band group BG2, in a third mode such as mode 84 during which the receiver receives signals in a third radio-frequency band group BG3, and so on.

During mode 80 when operating in BG1 (e.g., the lowest frequency operating band group), adjustable resistor Rin may be set to its minimum value Rlow by activating all or almost all of its resistor strings. During mode 82 when operating in BG2 (e.g., the next operating band group above BG1), adjustable resistor Rin may be adjusted to a different value to compensate for changes in the mixer Rout that result from switching from another mode to mode 82. During mode 84 when operating in BG3 (e.g., the next operating band group above BG2), adjustable resistor Rin may be adjusted to a different value to compensate for changes in the mixer Rout that result from switching from another mode to mode 84. In general, the receiver circuitry can be operated inn different modes of operation, where n can be equal to 5 or more, 6-10, 11-15, more than 10, or other suitable values.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:
1. Wireless circuitry comprising:
    a first amplifier configured to receive a radio-frequency signal and to generate a corresponding amplified signal;
    a mixer configured to receive the amplified signal and to generate a corresponding demodulated signal;
    a second amplifier configured to receive the demodulated signal; and
    an adjustable resistance coupled between the mixer and the second amplifier, wherein the adjustable resistance comprises
        a first terminal directly coupled to a first amplifier input terminal of the second amplifier,
        a second terminal directly coupled to a second amplifier input terminal of the second amplifier,
        a plurality of resistors, and
        a plurality of switches configured to selectively switch one or more resistors in the plurality of resistors into use.

2. The wireless circuitry of claim 1, wherein the second amplifier comprises a transimpedance amplifier.

3. The wireless circuitry of claim 1, further comprising:
    a first capacitor having a first terminal coupled to the first amplifier input terminal and having a second terminal coupled to a ground line; and
    a second capacitor having a first terminal coupled to the second amplifier input terminal and having a second terminal coupled to the ground line.

4. The wireless circuitry of claim 1, further comprising:
    a first feedback capacitor having a first terminal coupled to the first amplifier input terminal and having a second terminal coupled to a first amplifier output terminal of the second amplifier;
    a second feedback capacitor having a first terminal coupled to the second amplifier input terminal and having a second terminal coupled to a second amplifier output terminal of the second amplifier;
    a first feedback resistor having a first terminal coupled to the first amplifier input terminal and having a second terminal coupled to the first amplifier output terminal of the second amplifier; and
    a second feedback resistor having a first terminal coupled to the second amplifier input terminal and having a second terminal coupled to the second amplifier output terminal of the second amplifier.

5. The wireless circuitry of claim 1, further comprising:
    a first feedback capacitor having a first terminal coupled to the first amplifier input terminal and having a second terminal coupled to a first amplifier output terminal of the second amplifier; and
    a second feedback capacitor having a first terminal coupled to the second amplifier input terminal and having a second terminal coupled to a second amplifier output terminal of the second amplifier.

6. The wireless circuitry of claim 1, further comprising:
    a first feedback resistor having a first terminal coupled to the first amplifier input terminal and having a second terminal coupled to a first amplifier output terminal of the second amplifier; and
    a second feedback resistor having a first terminal coupled to the second amplifier input terminal and having a second terminal coupled to a second amplifier output terminal of the second amplifier.

7. The wireless circuitry of claim 1, further comprising:
    a control circuit configured to adjust the adjustable resistance based on an operating frequency associated with the mixer.

8. The wireless circuitry of claim 1, further comprising:
    a control circuit configured to adjust the adjustable resistance to compensate for changes in an output impedance of the mixer.

9. The wireless circuitry of claim 1, wherein the mixer is further configured to receive an oscillating signal, and wherein the adjustable resistance is tuned as a function of a frequency of the oscillating signal.

10. The wireless circuitry of claim 9, further comprising:
a control circuit configured to increase the adjustable resistance when the frequency of the oscillating signal rises.

11. The wireless circuitry of claim 10, wherein the control circuit is further configured to decrease the adjustable resistance when the frequency of the oscillating signal falls.

12. The wireless circuitry of claim 9, further comprising:
a control circuit configured to decrease the adjustable resistance when the frequency of the oscillating signal falls.

13. A method of operating wireless circuitry comprising:
receiving a radio-frequency signal and generating a corresponding amplified signal;
receiving the amplified signal and generating a corresponding demodulated signal based on an oscillating signal;
with an amplifier, receiving the demodulated signal; and
tuning a resistance at an input of the amplifier by increasing the resistance when a frequency of the oscillating signal rises and decreasing the resistance when the frequency of the oscillating signal falls.

14. The method of claim 13, wherein the amplifier comprises a transimpedance amplifier.

15. The method of claim 13, wherein:
the resistance comprises a plurality of resistive strings each having a first resistor, a second resistor, and a switch coupled between the first and second resistors in that resistive string; and
tuning the resistance comprises selectively activating and deactivating the switch in each resistive string in the plurality of resistive strings.

16. The method of claim 13, wherein:
the resistance comprises a plurality of resistive strings each having a first switch, a second switch, and a resistor coupled between the first and second switches in that resistive string; and
tuning the resistance comprises selectively activating and deactivating the first and second switches in each resistive string in the plurality of resistive strings.

17. Circuitry comprising:
a first differential circuit having an output impedance that varies as a function of frequency and is configured to receive a radio-frequency signal and an oscillating signal;
a second differential circuit configured to receive a signal from the first differential circuit;
an adjustable input resistance coupled at an input of the second differential circuit; and
a control circuit configured to increase the adjustable input resistance when a frequency of the oscillating signal rises and to decrease the adjustable input resistance when the frequency of the oscillating signal falls.

18. The circuitry of claim 17, wherein the first differential circuit comprises a radio-frequency mixer and wherein the second differential circuit comprises a transimpedance amplifier.

19. The circuitry of claim 17, wherein the second differential circuit further comprises:
a plurality of feedback capacitors; and
a plurality of feedback resistors.

* * * * *